United States Patent
Kim et al.

(10) Patent No.: US 8,324,571 B2
(45) Date of Patent: Dec. 4, 2012

(54) APPARATUS AND METHOD FOR MEASURING SEMICONDUCTOR DEVICE

(75) Inventors: Young-Seok Kim, Hwaseong-si (KR); Jong-Sun Peak, Seongnam-si (KR); Young-Nam Kim, Yongin-si (KR); Hyung-Suk Cho, Hwaseong-si (KR); Sun-Jin Kang, Suwon-si (KR); Bu-Dl Yoo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 304 days.

(21) Appl. No.: 12/713,261

(22) Filed: Feb. 26, 2010

(65) Prior Publication Data

US 2010/0219340 A1  Sep. 2, 2010

(30) Foreign Application Priority Data

Feb. 27, 2009  (KR) .................. 10-2009-0017169

(51) Int. Cl.
*G01N 23/20* (2006.01)
(52) U.S. Cl. ........ 250/306; 250/307; 250/309; 250/310; 250/311; 250/492.1; 250/492.2; 250/492.3
(58) Field of Classification Search .................. 250/306, 250/307, 309, 310, 311, 492.1, 492.2, 492.3
See application file for complete search history.

(56) References Cited

U.S. PATENT DOCUMENTS

2002/0188417 A1  12/2002  Levy et al.
2009/0206255 A1*  8/2009  Saito et al. ................... 250/310

FOREIGN PATENT DOCUMENTS

JP  2000-171212 A  6/2000
KR  10-2005-0027953 A  3/2005

* cited by examiner

*Primary Examiner* — Michael Maskell
*Assistant Examiner* — Hanway Chang
(74) *Attorney, Agent, or Firm* — Sughrue Mion, PLLC

(57) ABSTRACT

An apparatus for measuring a semiconductor device is provided. The apparatus includes a beam emitter configured to irradiate an electron beam onto a sample having the entire region composed of a critical dimension (CD) region, which is formed by etching or development, and a normal region connected to the CD region, and an analyzer electrically connected to the beam emitter, and configured to select and set a wavelength range of a region in which a difference in reflectance between the CD region and the normal region occurs, after obtaining reflectance from the electron beam reflected by a surface of the sample according to the wavelength of the electron beam. A method of measuring a semiconductor device using the measuring apparatus is also provided. Therefore, it is possible to minimize a change in reflectance due to the thickness and properties of the semiconductor device, and set a wavelength range to monitor a specific wavelength, thereby accurately measuring and analyzing a CD value of a measurement part of the semiconductor device.

18 Claims, 8 Drawing Sheets

CELL 1

CELL 2

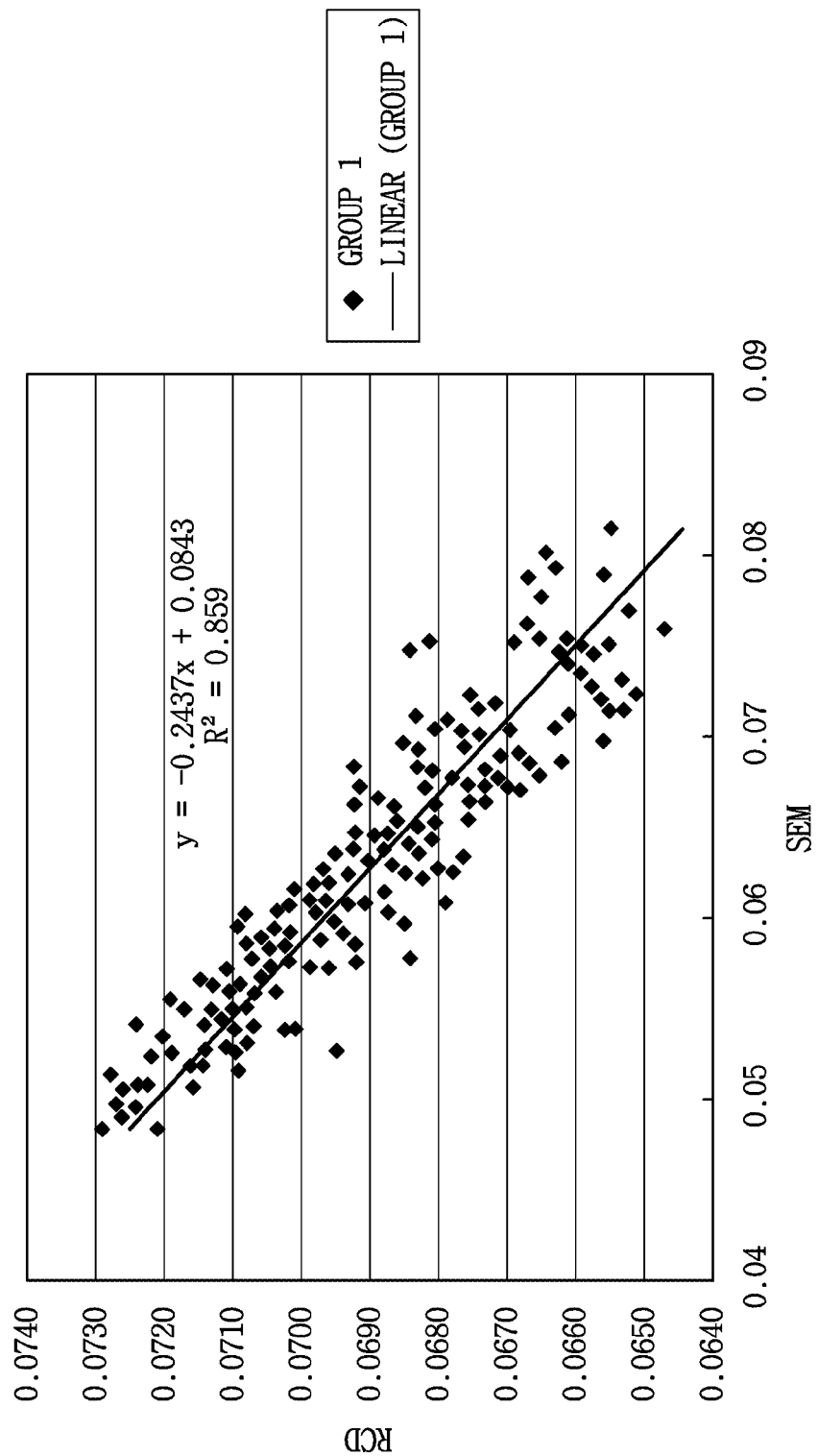

APPARATUS AND METHOD FOR MEASURING SEMICONDUCTOR DEVICE

PRIORITY STATEMENT

This application claims priority from Korean Patent Application No. 10-2009-0017169, filed on Feb. 27, 2009, the contents of which are hereby incorporated herein by reference in its entirety.

SUMMARY

Apparatuses and methods consistent with the exemplary embodiments relate to measuring a semiconductor device, and more particularly, to measuring a semiconductor device while minimizing a change in reflectance depending on the thickness and properties of a measured semiconductor device, and setting a wavelength range to monitor a specific wavelength so that a critical dimension (CD) value of a measurement portion of the semiconductor device can be accurately measured and analyzed.

Generally, semiconductor devices are manufactured by selectively or sequentially performing a plurality of unit processes such as deposition, etching, ion implantation, exposure, cleaning, etc., on a wafer.

A plurality of semiconductor devices are manufactured on the wafer, and then the semiconductor devices on the wafer are inspected through a measurement apparatus.

After forming a photoresist pattern on the wafer during a semiconductor device manufacturing process, a scanning electron microscope (SEM) may be used to measure after-develop inspection (ADI) critical dimension (CD) of the photoresist pattern.

A method of measuring CD using the SEM is as follows.

After forming a photoresist pattern to form a certain structure of pattern on a lower structure of the semiconductor device, the SEM scans an electron beam across the pattern to measure the CD of the formed pattern.

That is, the SEM scans an electron beam across the pattern, and uses secondary electrons (SE) emitted from the pattern to form an image, whereby the CD is measured.

However, when the CD is measured using the SEM, accuracy in measurement may be reduced due to a charging effect.

As an alternative technique, a method of measuring CD using optical critical dimension (OCD) metrology has been proposed. However, the OCD uses SE beams irradiated to a measurement surface of a sample at 65°. Therefore, the OCD has a problem that the SE beams may be scattered when the lower structure of the semiconductor device is complicated due to characteristics of the SE beams.

In addition, while the OCD uses SR beams irradiated to a measurement surface of a sample at 90°, a plurality of signals are also detected due to the pattern when the lower pattern structure of the semiconductor device is complicated, thereby making it difficult to distinguish the signals from signals required to measure CD.

One or more exemplary embodiments provide an apparatus and method for measuring a semiconductor device that are capable of reducing a difference in reflectance caused by an etched or developed region when reflectance of a semiconductor device is measured using SR beams.

One or more exemplary embodiments also provide an apparatus and method for measuring a semiconductor device that are capable of setting a wavelength region to measure and analyze a CD value of a specific wavelength when the CD value of a semiconductor device is measured.

One or more exemplary embodiments also provide an apparatus and method for measuring a semiconductor device that are capable of analyzing correlation between a CD value obtained using a difference in reflectance of semiconductor devices and a CD value obtained using a SEM to improve reliability of the CD value.

According to one or more exemplary embodiments, the apparatus may include: a beam emitter configured to irradiate an electron beam onto a sample having the entire region composed of a CD region, which is formed by etching or development, and a normal region connected to the CD region; and an analyzer electrically connected to the beam emitter, and configured to select and set a wavelength range of a region in which a difference in reflectance between the CD region and the normal region occurs, after obtaining reflectance from the electron beam reflected by a surface of the sample according to the wavelength of the electron beam.

The analyzer may measure first reflectance values depending on the wavelength of the CD region, measure second reflectance values depending on the wavelength of the normal region, and select and set a wavelength range including a maximum first reflectance value of the measured first reflectance values and a minimum second reflectance value of the measured second reflectance values; and may calculate a first CD value of the sample using a difference between the first and second reflectance values included in the wavelength range.

In addition, the analyzer may be electrically connected to an SEM. The SEM may measure second CD values included in the wavelength range to transmit the values to the analyzer, and the analyzer may distribute first CD values and second CD values according to the set wavelength range on X-Y coordinates, and perform regression analysis on the distributed first and second CD values to initially calculate a coefficient of determination.

Further, the analyzer may calculate average values of the distributed first and second CD values according to wavelength sections included in the wavelength range on the basis of any one of the first CD value and the second CD value to distribute the average values on the X-Y coordinates, and perform regression analysis on the distributed average values to calculate the coefficient of determination again.

Furthermore, the analyzer may preset a determination range included in a range of 0 to 1, and when the initially calculated coefficient of determination is included in the determination range, may calculate the coefficient of determination again.

One or more exemplary embodiments provide a method of measuring a semiconductor device.

The method may include: irradiating an electron beam onto a sample having the entire region composed of a CD region, which is formed by etching or development, and a normal region connected to the CD region; and selecting and setting a wavelength range of a region in which a difference in reflectance between the CD region and the normal region occurs, after obtaining reflectance from the electron beam reflected by a surface of the sample according to the wavelength of the electron beam.

Here, selecting and setting the wavelength range may include measuring first reflectance values depending on the wavelength of the CD region; measuring second reflectance values depending on the wavelength of the normal region; selecting and setting a wavelength range including a maximum first reflectance value of the measured first reflectance values and a minimum second reflectance value of the measured second reflectance values; and calculating a first CD value of the sample using a difference between the first and second reflectance values included in the wavelength range.

In addition, after calculating the first CD values, second CD values included in the wavelength range may be measured using an SEM, the first CD values and the second CD values according to the set wavelength range may be distributed on X-Y coordinates, and correlation between the distributed first and second CD values may be regression-analyzed to initially calculate a coefficient of determination.

Further, after initially calculating the coefficient of determination, average values of the distributed first and second CD values according to wavelength sections included in the wavelength range may be calculated on the basis of any one of the first CD value and the second CD value to be distributed on the X-Y coordinates, and the distributed average values may be regression-analyzed to calculate the coefficient of determination again.

Furthermore, when the initially calculated coefficient of determination is included in a determination range of 0 to 1, the coefficient of determination may be calculated again.

BRIEF DESCRIPTION OF THE DRAWINGS

Example embodiments are described in further detail below with reference to the accompanying drawings. It should be understood that various aspects of the drawings may have been exaggerated for clarity.

FIG. 7 is a graph of results of primary regression analysis showing correlation between SEM CD and RCD CD.

DETAILED DESCRIPTION OF EXEMPLARY EMBODIMENTS

Figure 1:
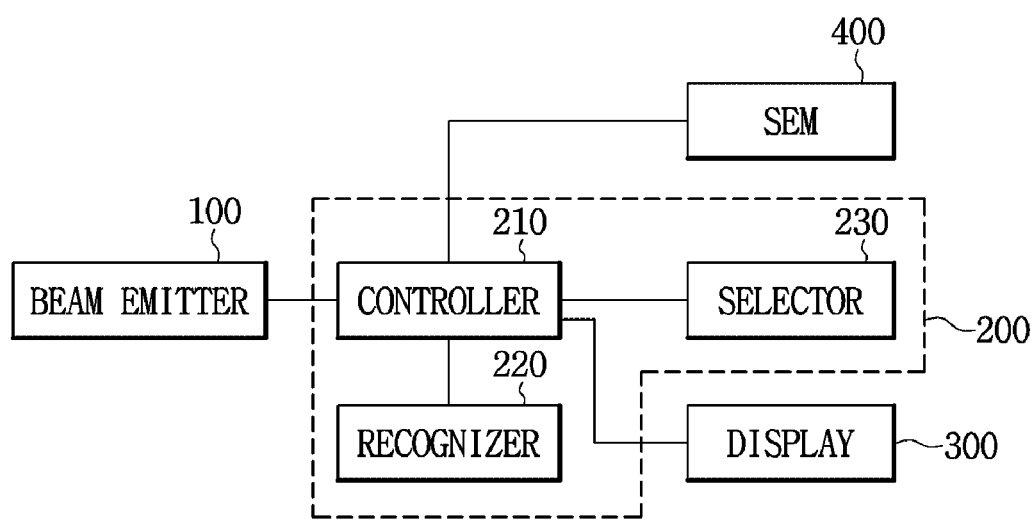
FIG. 1 is a block diagram schematically showing an apparatus for measuring a semiconductor device in accordance with an exemplary embodiment.

Various exemplary embodiments will now be described more fully with reference to the accompanying drawings in which some exemplary embodiments are shown. In the drawings, the thicknesses of layers and regions may be exaggerated for clarity.

Detailed illustrative embodiments are disclosed herein. However, specific structural and functional details disclosed herein are merely representative for purposes of describing exemplary embodiments. The exemplary embodiments, however, may be embodied in many alternate forms and should not be construed as limited to only the exemplary embodiments set forth herein.

Accordingly, while exemplary embodiments are capable of various modifications and alternative forms, embodiments thereof are shown by way of example in the drawings and will herein be described in detail. It should be understood, however, that there is no intent to limit the exemplary embodiments to the particular forms disclosed, but on the contrary, exemplary embodiments are to cover all modifications, equivalents, and alternatives thereof. Like numbers refer to like elements throughout the description of the figures.

An apparatus and method for measuring a semiconductor device according to exemplary embodiments will be described in detail with reference to the attached drawings.

First, an apparatus for measuring a semiconductor device in accordance with an exemplary embodiment will be described with reference to FIG. 1.

Figure 6A:
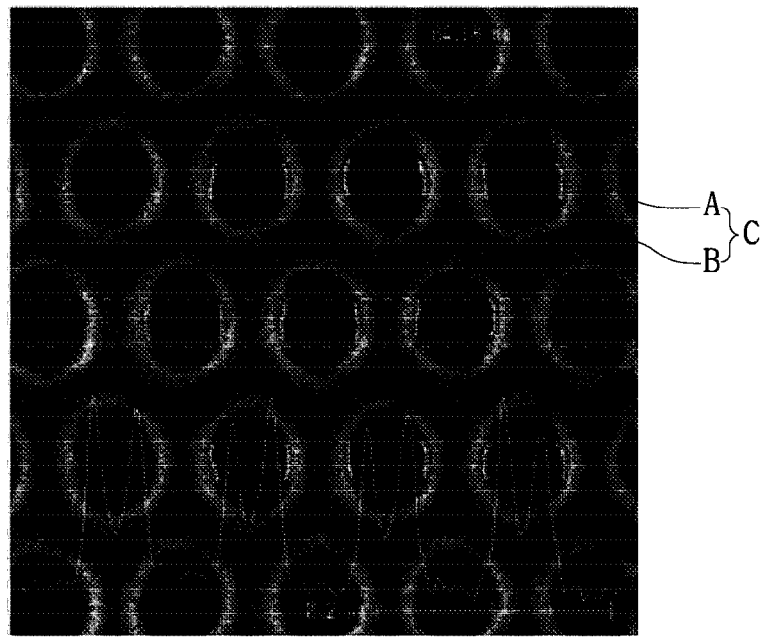
FIGS. 6A and 6B are views showing examples of semiconductor devices having different CD values.
Figure 6B:
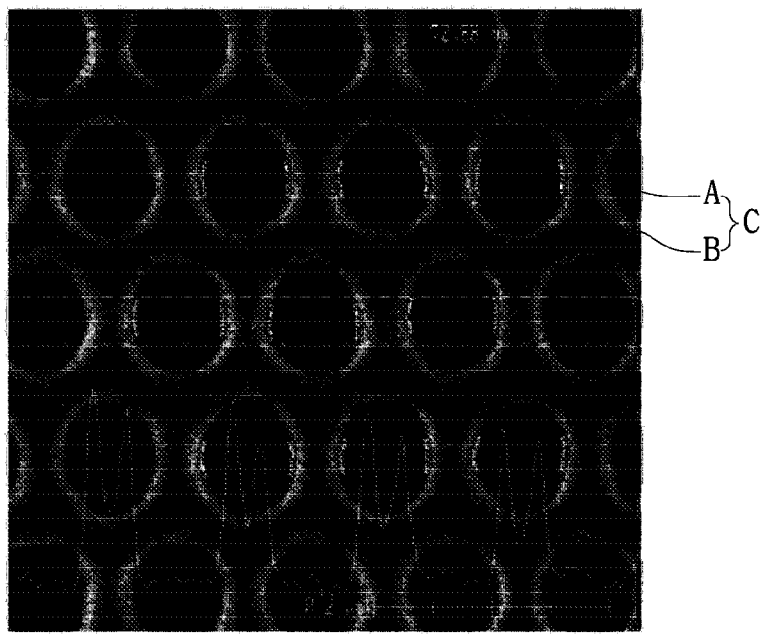

The apparatus for measuring a semiconductor device in accordance with an exemplary embodiment may measure a critical dimension of semiconductor devices manufactured on a wafer. The semiconductor devices may be samples CELL1 and CELL2 (see FIGS. 6A and 6B) used as measurement subjects. The semiconductor device includes the entire region C composed of a CD region A which is formed by etching or development, and a normal region B (OS1, not an etched or developed region) connected to the CD region A. The normal region B and the CD region A have CD values at intervals of several micrometers.

The apparatus according to an exemplary embodiment includes a beam emitter 100, an analyzer 200, and a display 300 configured to display the measured and analyzed results from the analyzer 200. Here, the analyzer 200 may be electrically connected to an alarm generator (not shown).

The beam emitter 100 may receive power from the exterior to irradiate electron beams such as SR beams onto the sample CELL. Here, the sample CELL has a measurement surface to which the electron beams are irradiated. In addition, the irradiation path of the electron beam may be perpendicular to the measurement surface.

The analyzer 200 may be electrically connected to the beam emitter 100, and include a recognizer 220 and a controller 210. Here, the controller 210 may be connected to a selector 230 configured to select a plurality of wavelengths with respect to electron beams. In addition, while not shown, the selector 230 may be electrically connected to an input part configured to select and input one or more of the wavelengths.

The recognizer 220 may recognize a reflectance value from an electron beam reflected from the surface of the sample CELL (or the measurement surface) to transmit it to the controller 210.

The controller 210 may set a wavelength range a (see FIG. 5) of a region in which a difference in reflectance between the CD region A and the normal region B occurs, after obtaining a reflectance value according to the wavelength of the electron beam.

Here, the analyzer 200 may measure first reflectance values according to the wavelength of the CD region A using the recognizer 220, and measure second reflectance values according to the wavelength of the normal region B.

Figure 5:
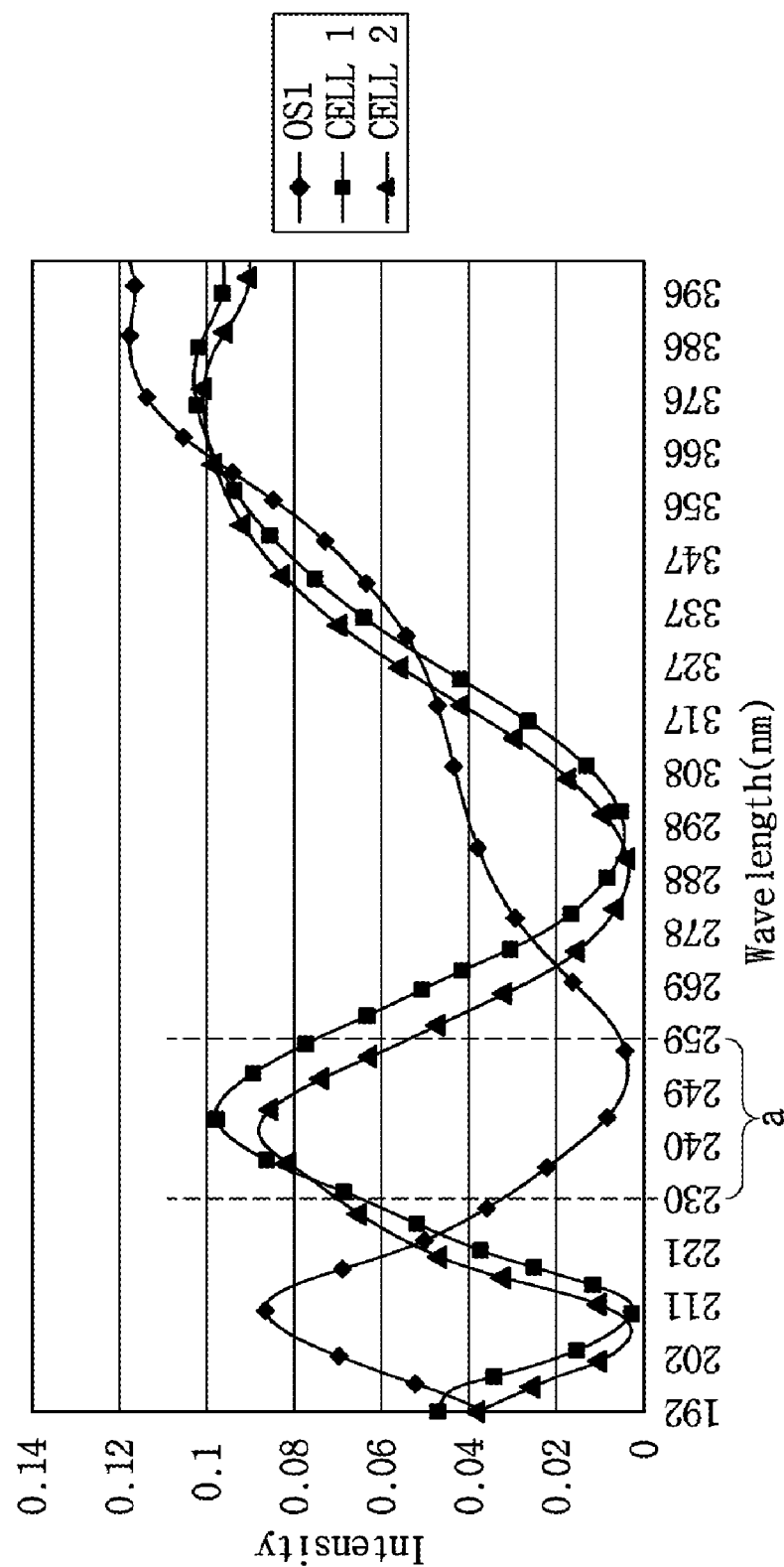
FIG. 5 is a graph of reflectance conversion in the entire wavelength obtained through an analyzer in accordance with an exemplary embodiment.

In addition, referring to FIG. 5, it is possible for the controller 210 to select and set a wavelength range "a" including a maximum first reflectance value of the measured first reflectance values and a minimum second reflectance value of the measured second reflectance values.

Further, the controller 210 may calculate first CD values of the sample CELL through differences between first reflectance values and second reflectance values included in the wavelength range "a".

Furthermore, the analyzer 200 may be electrically connected to an SEM 400. The SEM 400 may be electrically connected to the controller 210.

Here, the SEM 400 measures second CD values included in the wavelength range "a" to transmit the values to the controller 210.

In addition, referring to FIG. 7, the controller 210 of the analyzer 200 distributes first CD values and second CD values according to the set wavelength range "a" on the X-Y coordinates, and performs regression analysis on the distributed first and second CD values to initially calculate a coefficient of determination $R^2$.

For example, referring to FIG. 7, it will be appreciated that a correlation equation is Y=−0.2437X+0.0843, and the coefficient of determination is 0.859.

Figure 8:
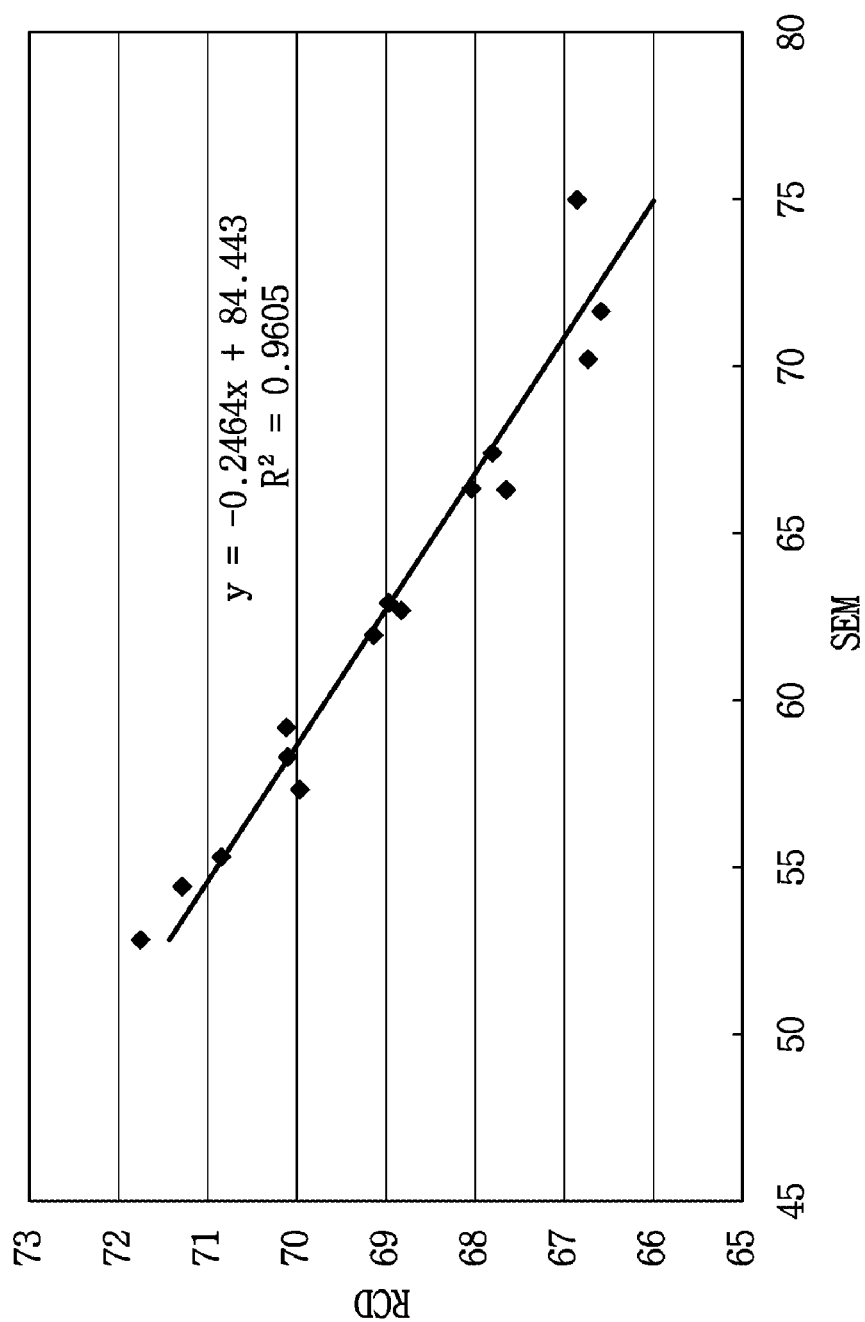
FIG. 8 is a graph of results of secondary regression analysis in which reflectance values according to wavelength sections in a wavelength range in accordance with an exemplary embodiment are converted into CD values.

Further, referring to FIG. 8, the controller 210 of the analyzer 200 may calculate average values of the distributed first and second CD values on the basis of any one of the first CD value and the second CD value to distribute the average values on the X-Y coordinates, and perform regression analysis on the distributed average values to calculate the coefficient of determination $R^2$ again.

Referring to FIG. 8, the correlation equation is Y=−0.2464X+84.443, and the coefficient of determination is 0.9605. Since the coefficient of determination is 0.9605, which is approximately 1, it is possible to determine that significance of correlation is high.

Furthermore, the analyzer 200 may calculate the coefficient of determination again, when the determination range Δt included in a range of 0 to 1 is preset and the initially calculated coefficient of determination $R^2$ is included in the determination range Δt.

Meanwhile, the display 300 may receive the set wavelength range "a" and the calculated coefficient of determination from the controller 210 to display them to the exterior. In addition, when the coefficient of determination from the controller 210 departs from the determination range Δt, the display 300 may display it to the exterior.

Hereinafter, a method of measuring a semiconductor device using the above apparatus for measuring a semiconductor device will be described.

A sample CELL is prepared as a measurement subject. Here, the sample CELL has an entire region C composed of an etched or developed CD region A, and a normal region B connected to the CD region A.

Figure 2:
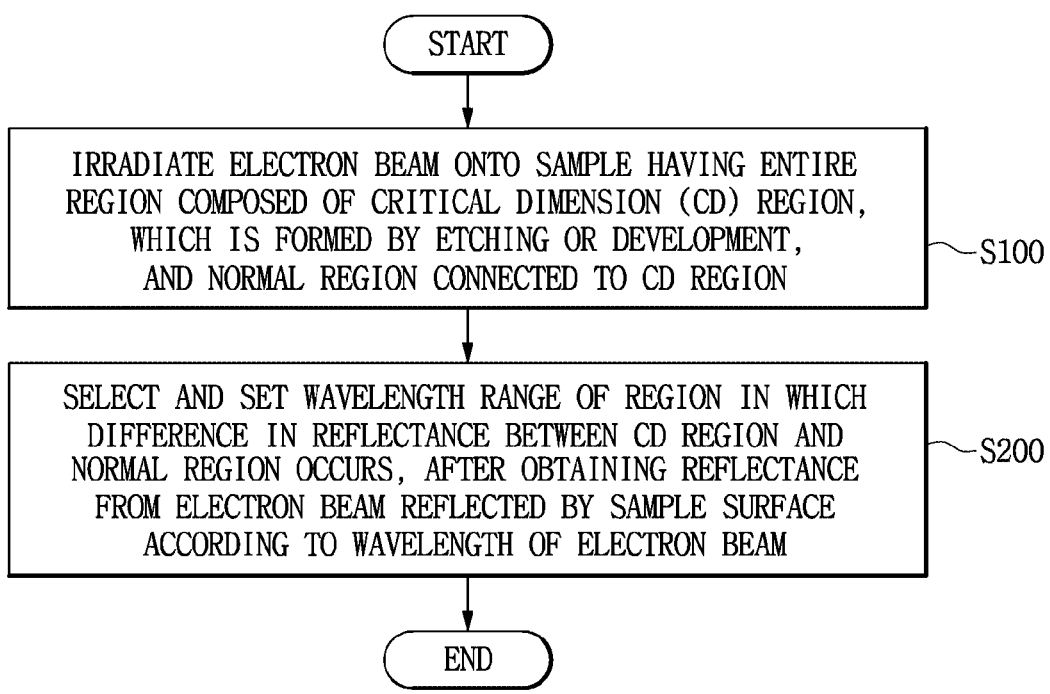
FIG. 2 is a flowchart showing a method of measuring a semiconductor device in accordance with an exemplary embodiment.

Referring to FIGS. 1 and 2, the method of measuring a semiconductor device includes irradiating electron beams to a sample CELL having the entire region C composed of a CD region A, which is formed by etching or development, and a normal region B connected to the CD region A (S100), and selecting and setting a wavelength range "a" of a region in which a difference in reflectance between the CD region A and the normal region B occurs, after obtaining reflectance from the electron beam reflected by the surface of the sample CELL according to the wavelength of the electron beam (S200).

Figure 3:
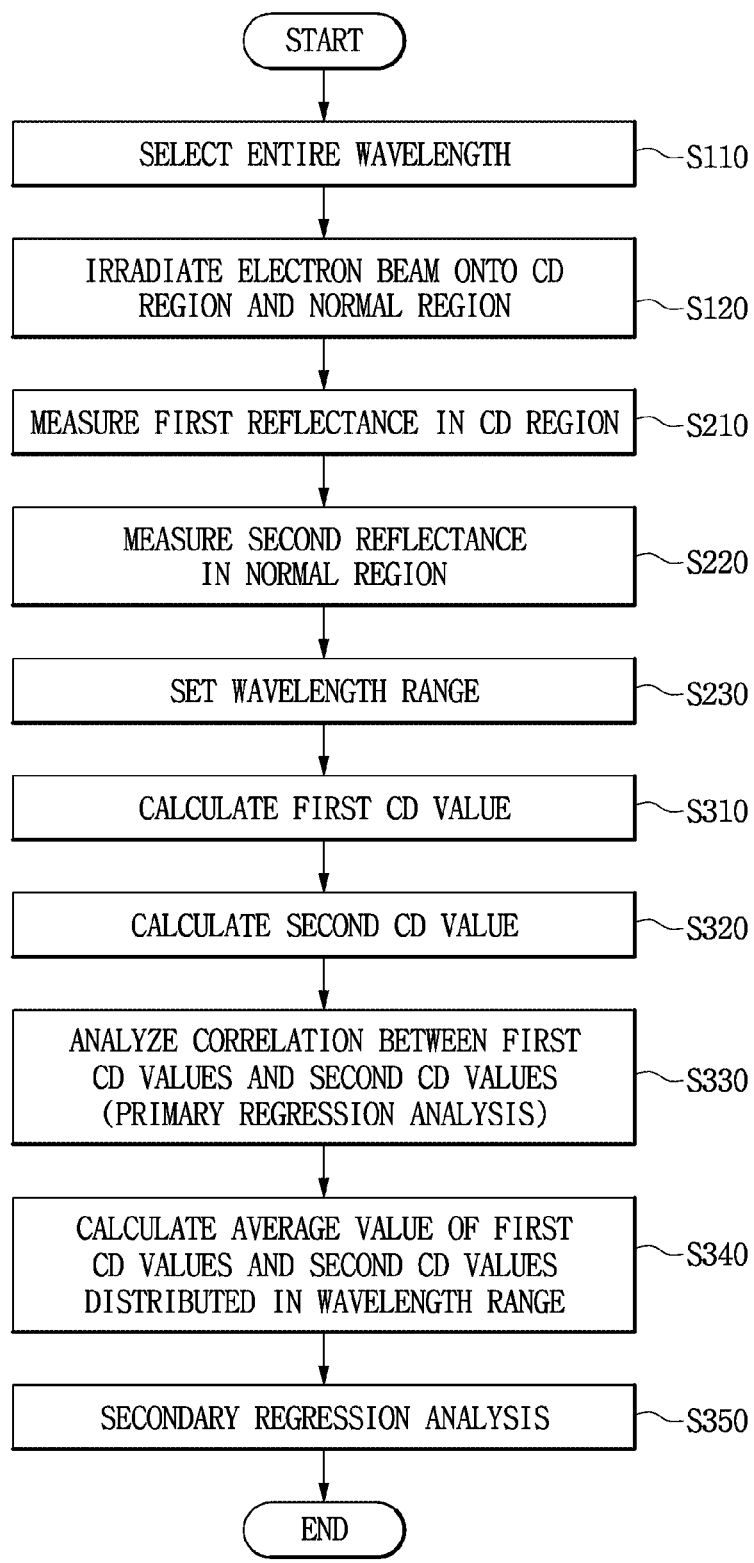
FIG. 3 is a flowchart specifically showing the method of measuring a semiconductor device of FIG. 2.

Specifically describing with reference to FIGS. 1 and 3, the controller 210 of the analyzer 200 may set the entire wavelength of the electron beams (S110). Here, the analyzer 200 may transmit an electrical signal to the controller 210 to select the entire wavelength or a certain range of wavelength using the selector 230.

Next, the controller 210 of the analyzer 200 transmits an electrical signal to the beam emitter 100. The beam emitter 100 may irradiate electron beams such as SR beams onto a measurement surface of the sample CELL (S120). At this time, the electron beams may be sequentially irradiated onto the CD region A and the normal region B. In addition, the irradiation path of the beam irradiated from the beam emitter 100 may be perpendicular to the measurement surface of the sample CELL.

While not shown, an angle between the irradiation path of the beam and the measurement surface of the sample CELL may be varied by a rotary motor (not shown) installed at the beam emitter 100. Here, the rotary motor may be electrically connected to the controller 210 to receive an electrical signal from the controller 210 and to be rotated to form a preset rotation angle (an angle between the beam irradiation path and the measurement surface).

Here, when the entire wavelength is selected by the selector 230, the controller 210 may operate the beam emitter 100 to irradiate electron beams constituting the entire wavelength.

Therefore, the beam emitter 100 perpendicularly irradiates the entire wavelength of electron beams on to the measurement surface of the CD region A of the etched or developed sample CELL and the normal region B, which is not etched or developed.

In addition, the recognizer 220 of the analyzer 200 recognizes or measures first reflectance values according to the entire wavelength in the CD region A (S210).

Further, the recognizer 220 of the analyzer 200 recognizes or measures second reflectance values according to the wavelength of the normal region B (S220).

The recognizer 220 may transmit the recognized first and second reflectance values to the controller 210. Here, the first and second reflectance values may be displayed as data illustrating strength according to the entire wavelength.

Next, the controller 210 may select and set a wavelength range "a" including a maximum first reflectance value of the first reflectance values transmitted from the recognizer 220 and a minimum second reflectance value of the measured second reflectance values (S230).

Therefore, by selecting a minimum reflectance range by the region B, which is not etched or developed at the sample CELL, it is possible to minimize a change in reflectance according to changes in thickness and property of photoresist of the sample CELL. In addition, a section in which a difference in reflectance occurs may be set by setting a region generating a difference in reflectance according to CD.

After setting the wavelength range "a", the controller 210 may calculate first CD values of the sample CELL through differences between the first reflectance values and the second reflectance values included in the wavelength range "a" (S310).

Further, the controller 210 may measure second CD values included in the wavelength range "a" using the SEM 400, after calculating the first CD values (S320).

Next, as shown in FIG. 7, the controller 210 distributes the first CD values and the second CD values according to the set wavelength range "a" on X-Y coordinates. Here, data according to the X coordinate may be the second CD values, and data according to the Y coordinate may be the first CD values.

Furthermore, the controller 210 may perform regression analysis on the distributed first and second CD values to initially calculate a coefficient of determination $R^2$ (S330). For example, the regression-analyzed graph may be expressed as a linear function. That is, it is possible to be expressed as Y=AX+B, wherein X is an independent parameter, Y is a parameter dependent on X, and B is an error term.

At this time, the controller 210 may initially calculate the coefficient of determination $R^2$. Here, the coefficient of determination $R^2$ may be determined within a range of 0 to 1, and it may be construed that correlation between the two parameters (independent and dependent parameters) is increases as it approaches 1.

In addition, as shown in FIG. 8, the controller 210 calculates average values of the first and second CD values distributed on the X-Y coordinates on the basis of any one of the first CD value and the second CD value (S340) to distribute the average values on the X-Y coordinates after initially calculating the coefficient of determination $R^2$, and performs regression analysis on the distributed average values to form a correlation equation Y=AX+B and then calculate the coefficient of determination $R^2$ again.

Here, since the coefficient of determination $R^2$ is 0.96, which is approximately 1, correlation between the first CD value and the second CD value is very high.

Figure 4:
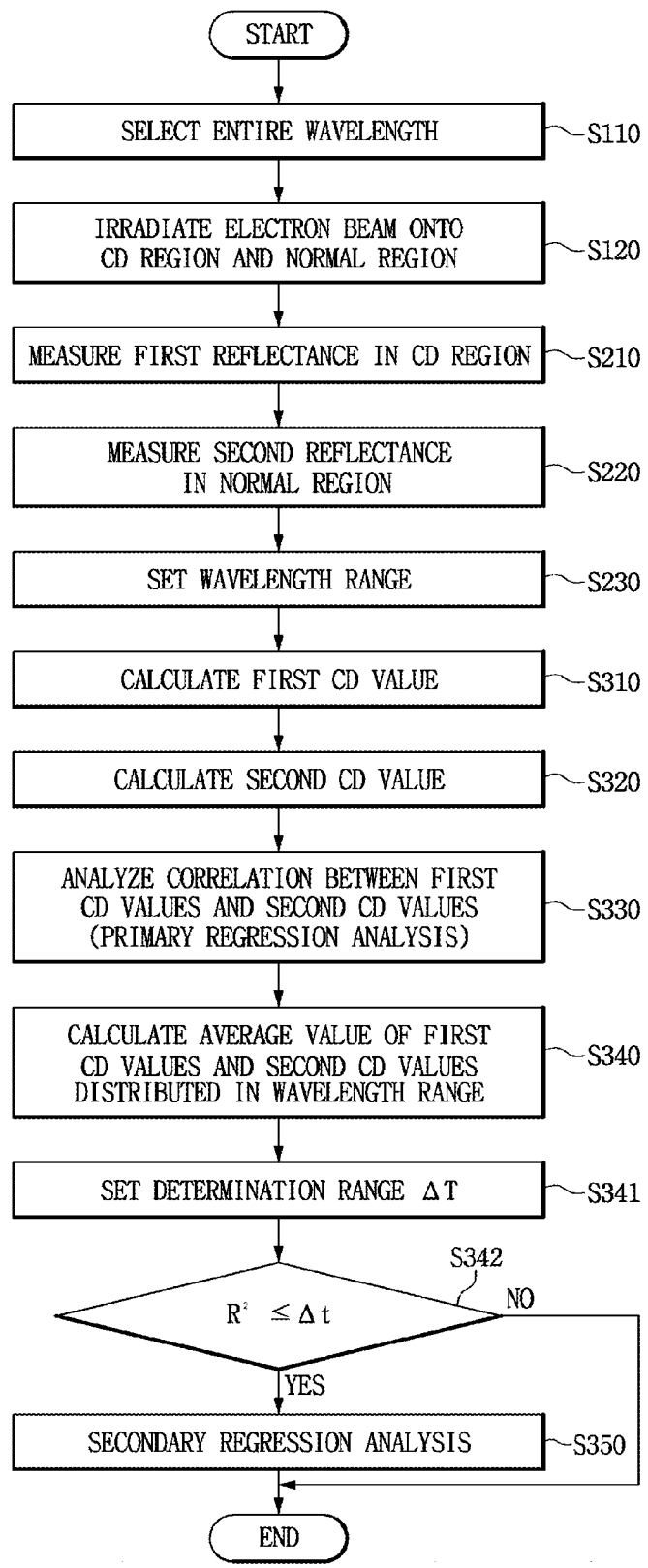
FIG. 4 is a flowchart showing a method of measuring a semiconductor device in accordance with another exemplary embodiment.

Referring to FIG. 4, the controller 210 may further set a determination range Δt (S341). In this case, the controller 210 may calculate the coefficient of determination $R^2$ again (S350) when the initially calculated coefficient of determination $R^2$ is included in the determination range Δt of 0 to 1 (S342).

As can be seen from the foregoing, when reflectance of a semiconductor device is measured using SR beams from the beam emitter 100, it is possible to reduce an error of a CD value using a difference in reflectance caused by an etched or developed region.

In addition, when a CD value of the semiconductor device is measured by the controller, it is possible to set a wavelength region to measure and analyze a CD value of a specific wavelength.

Further, it is possible to analyze correlation between a CD value obtained using a difference in reflectance of the semiconductor device and a CD value obtained using a SEM to improve reliability of the CD value.

The foregoing description is illustrative of exemplary embodiments and is not to be construed as limiting thereof. Although a few exemplary embodiments have been described, those skilled in the art will readily appreciate that many modifications to the exemplary embodiments are possible without materially departing from the exemplary embodiments. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific embodiments disclosed, and that modifications to the disclosed embodiments, as well as other embodiments, are intended to be included within the scope of the appended claims.

What is claimed is:

1. An apparatus for measuring a semiconductor device, comprising:
   a beam emitter configured to irradiate an electron beam onto a sample having an entire region comprising a critical dimension (CD) region, and a normal region connected to the CD region; and
   an analyzer electrically connected to the beam emitter, and configured to obtain reflectance values from the electron beam reflected by a surface of the sample, and select and set a wavelength range of a region in which a difference between first reflectance values of the CD region and second reflectance values of the normal region occurs.

2. The apparatus according to claim 1, wherein the analyzer measures the first reflectance values according to a wavelength of the electron beam reflected by the CD region, measures the second reflectance values according to a wavelength of the electron beam reflected by the normal region, and selects and sets the wavelength range including a maximum first reflectance based on the first reflectance value and a minimum second reflectance value based on the second reflectance values; and
   calculates first CD values according to a difference between the first and second reflectance values included in the wavelength range.

3. The apparatus according to claim 2, further comprising a scanning electron microscope (SEM) that is electrically connected to the analyzer,
   wherein the controller measures second CD values included in the wavelength range using the SEM, and the analyzer distributes the first CD values and the second CD values according to the wavelength range on X-Y coordinates, and performs a first regression analysis on the distributed first and second CD values to calculate a first coefficient of determination.

4. The apparatus according to claim 3, wherein the analyzer calculates average values of the distributed first and second CD values according to at least a portion of the wavelength range on the basis of any CD value of the first CD values and the second CD values, distributes the average values on the X-Y coordinates, and
   performs a second regression analysis on the distributed average values to calculate a second coefficient of determination.

5. The apparatus according to claim 4, wherein the analyzer presets a determination range included in a range of 0 to 1, and if the first coefficient of determination is included in the determination range, calculates the second coefficient of determination.

6. The apparatus according to claim 1, wherein the CD region is formed by etching or developing.

7. The apparatus according to claim 6, wherein the normal region is not formed by etching or developing.

8. The apparatus according to claim 1, wherein the beam emitter comprises a rotary motor configured to vary an angle between an irradiation path of the electron beam and the surface of the sample.

9. The apparatus according to claim 1, wherein an irradiation path of the electron beam is perpendicular to the surface of the sample.

10. A method of measuring a semiconductor device, comprising:
    irradiating an electron beam onto a sample having an entire region comprising a critical dimension (CD) region, and a normal region connected to the CD region; and
    obtaining reflectance values from the electron beam reflected by a surface of the sample, and selecting and setting a wavelength range of a region in which a difference between first reflectance values of the CD region and second reflectance values of the normal region occurs.

11. The method according to claim 10, wherein selecting and setting the wavelength range comprises:
    measuring the first reflectance values according to a wavelength of the electron beam reflected by the CD region;
    measuring the second reflectance values according to a wavelength of the electron beam reflected by the normal region;
    selecting and setting the wavelength range including a maximum first reflectance value based on the first reflectance values and a minimum second reflectance value based on the second reflectance values; and
    calculating first CD values according to a difference between the first and second reflectance values included in the wavelength range.

12. The method according to claim 11, further comprising:
measuring second CD values included in the wavelength range using a scanning electron microscope (SEM),
distributing the first CD values and the second CD values according to the wavelength range on X-Y coordinates, and
performing a first regression analysis on the distributed first and second CD values to calculate a first coefficient of determination.

13. The method according to claim 12, further comprising:
calculating average values of the distributed first and second CD values according to at least a portion of the wavelength range on the basis of any CD value of the first CD values and the second CD values;
distributing the average values on the X-Y coordinates, and
performing a second regression analysis on the distributed average values to calculate a second coefficient of determination.

14. The method according to claim 13, wherein, the second coefficient of determination is calculated if the first coefficient of determination is included in a determination range of 0 to 1.

15. The method according to claim 10, wherein the CD region is formed by etching or developing.

16. The method according to claim 15, wherein the normal region is not formed by etching or developing.

17. The method according to claim 10, further comprising varying an angle between an irradiation path of the electron beam and the surface of the sample.

18. The method according to claim 10, wherein the irradiating an electron beam comprises irradiating the electron beam perpendicularly to the surface of the sample.

* * * * *